US008621258B2

(12) United States Patent
Akagi et al.

(10) Patent No.: US 8,621,258 B2
(45) Date of Patent: Dec. 31, 2013

(54) DEVICE FOR OPERATING TWO MEMORY CARDS IN TWO SOCKETS WITH DIFFERENT PIN ARRANGEMENTS

(75) Inventors: Katsutoshi Akagi, Santa Clara, GA (US); Miki Takahashi, San Jose, CA (US)

(73) Assignee: Maishi Electronic (Shanghai) Ltd., Shanghai (CN)

( * ) Notice: Subject to any disclaimer, the term of this patent is extended or adjusted under 35 U.S.C. 154(b) by 249 days.

(21) Appl. No.: 13/185,116

(22) Filed: Jul. 18, 2011

(65) Prior Publication Data
US 2013/0024712 A1    Jan. 24, 2013

(51) Int. Cl.
*G06F 1/00*    (2006.01)
*G11C 5/14*    (2006.01)

(52) U.S. Cl.
USPC ............................ 713/330; 713/300; 365/226

(58) Field of Classification Search
USPC .................................. 713/300, 330; 365/226
See application file for complete search history.

(56) References Cited

U.S. PATENT DOCUMENTS

| | | | | |
|---|---|---|---|---|
| 6,147,871 A | * | 11/2000 | DeWitt et al. | 361/752 |
| 2002/0041020 A1 | * | 4/2002 | Ono et al. | 257/685 |
| 2002/0141238 A1 | * | 10/2002 | Pasternak | 365/185.11 |
| 2004/0232938 A1 | * | 11/2004 | Kim et al. | 324/765 |
| 2009/0248926 A1 | * | 10/2009 | Egy et al. | 710/104 |
| 2011/0138211 A1 | * | 6/2011 | Kim | 713/324 |
| 2011/0289272 A1 | * | 11/2011 | Chu et al. | 711/114 |
| 2011/0314307 A1 | * | 12/2011 | Lee | 713/300 |
| 2012/0190219 A1 | * | 7/2012 | Pai et al. | 439/65 |

* cited by examiner

*Primary Examiner* — Vincent Tran
(74) *Attorney, Agent, or Firm* — Wang Law Firm, Inc.; Li K. Wang; Stephen Hsu (57) ABSTRACT

Embodiments in accordance with the present invention provide devices and methods for operating two memory cards. In one embodiment, an electronic device includes a host controller, a first socket in communication with the host controller, for receiving a first memory card and a second socket, and a second socket in communication with the host controller, for receiving a second memory card. The physical pin arrangement of the second socket is in an order reversed from the physical pin arrangement of the first socket. The host controller transmits power to the first memory card and cuts off power to the second memory card during a first time period, and cuts off power to the first memory card and transmits power to the second memory card during a second time period. The first socket and the second socket transmit and receive same set of data signals.

15 Claims, 5 Drawing Sheets

DEVICE FOR OPERATING TWO MEMORY CARDS IN TWO SOCKETS WITH DIFFERENT PIN ARRANGEMENTS

BACKGROUND

Memory card is an electronic flash memory data storage device used for storing digital information. Memory cards are commonly used in many electronic devices, such as digital cameras, mobile phones, laptop computers, MP3 players, and video game consoles. One popular type of memory cards is secure digital (SD) cards. SD cards are small and light, and are suitable as data storage in portable electronic devices.

Figure 1:
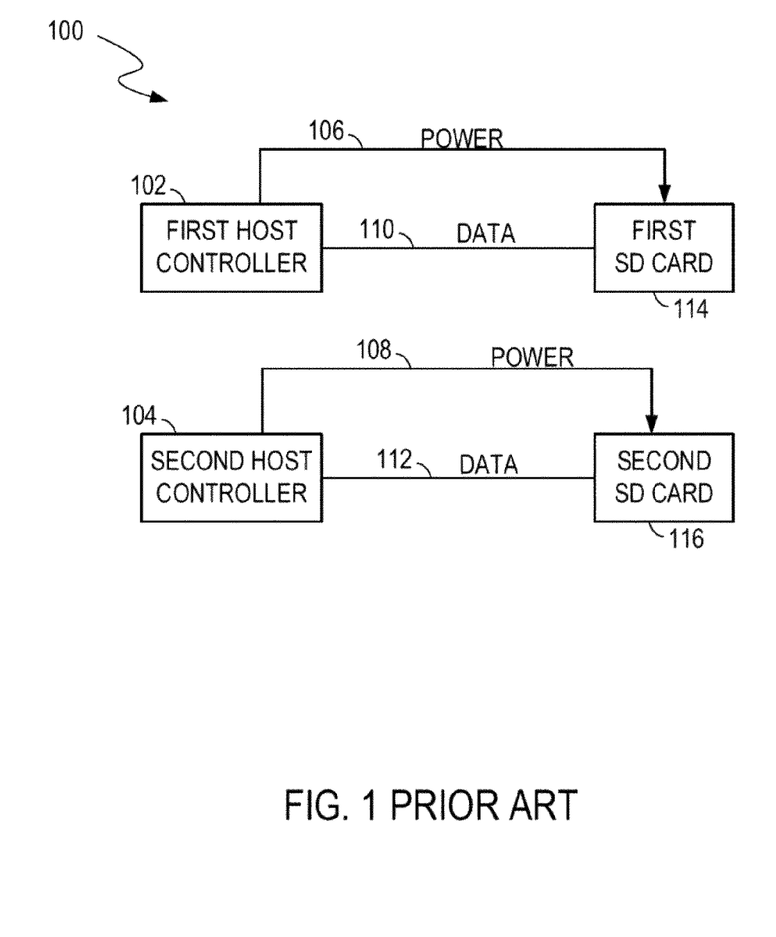
FIG. 1 shows a conventional electronic device that operates two memory cards by two host controllers.

Some electronic devices operate with two or more memory cards. For example, in some high end digital camera, two memory cards are presented. One memory card is used for storing raw image file which contains the unprocessed data from the sensor, and other memory card is used for storing compressed JPEG files. FIG. 1 shows a conventional electronic device 100 that operates two SD cards. The electronic device 100 includes a first host controller 102 for operating a first SD card 114, and a second host controller 104 for operating a second SD card 116. The first host controller 102 powers the first SD card 114 via a first power line 106. A first data bus 110 is coupled between the first host controller 102 and the first SD card 114 for transmitting data between the first host controller 104 and the first SD card 114. Similarly, the second host controller 104 powers the second SD card 116 via a second power line 108. A second data bus 112 is coupled between the second host controller 104 and the second SD card 116 for transmitting data between the second host controller 104 and the second SD card 116. One drawback of this conventional electronic device 100 is that two individual host controllers are needed in order to operate two SD cards respectively, and thus the cost is increased.

SUMMARY

Embodiments in accordance with the present invention provide devices and methods for operating two memory cards. In one embodiment, an electronic device includes a host controller, a first socket in communication with the host controller, for receiving a first memory card, and a second socket in communication with the host controller, for receiving a second memory card. The physical pin arrangement of the second socket is in an order reversed from the physical pin arrangement of the first socket. The host controller transmits power to the first memory card and cuts off power to the second memory card during a first time period, and cuts off power to the first memory card and transmits power to the second memory card during a second time period. The first socket and the second socket transmit and receive same set of data signals.

In another embodiment, an electronic device includes a host controller a host controller, a first socket in communication with the host controller, for receiving a first memory card and a second socket, and a second socket in communication with the host controller, for receiving a second memory card. The physical pin arrangement of the second socket is in an order reversed from the physical pin arrangement of the first socket. The host controller comprises a first power terminal for powering the first memory card, a second power terminal for powering the second memory card, and a power switch coupled to the first power terminal and the second power terminal and for selectively delivering power to one memory card of the first memory card and the second memory card. During a first time period, the host controller transmits power to the first memory card and cuts off power to the second memory card. During a second time period, the host controller transmits power to the second memory card and cuts off power to the first memory card. The first socket and the second socket transmit and receive same set of data signals.

In another embodiment, a method for operating an electronic device, includes controlling a power switch coupled between a power source and a plurality of memory devices comprising a first memory device and a second memory device; connecting the power source to the first memory device if the power switch is coupled between the power source and the first memory device; powering the first memory device and cutting off power to the second memory card; connecting the power source to the second memory device if the power switch is coupled between the power source and the second memory device; and powering the second memory device and cutting off power to the first memory card.

In yet another embodiment, a method for seamless transition between two memory devices, includes selecting a first memory device by a selection unit; powering up the first memory device by a power source and powering off a second memory device; accessing the first memory device while the second memory device is powered off; selecting the second memory device by the selection unit; powering up the second memory device by the power source and powering off the first memory device; and accessing the second memory device while the first memory device is powered off.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 2:
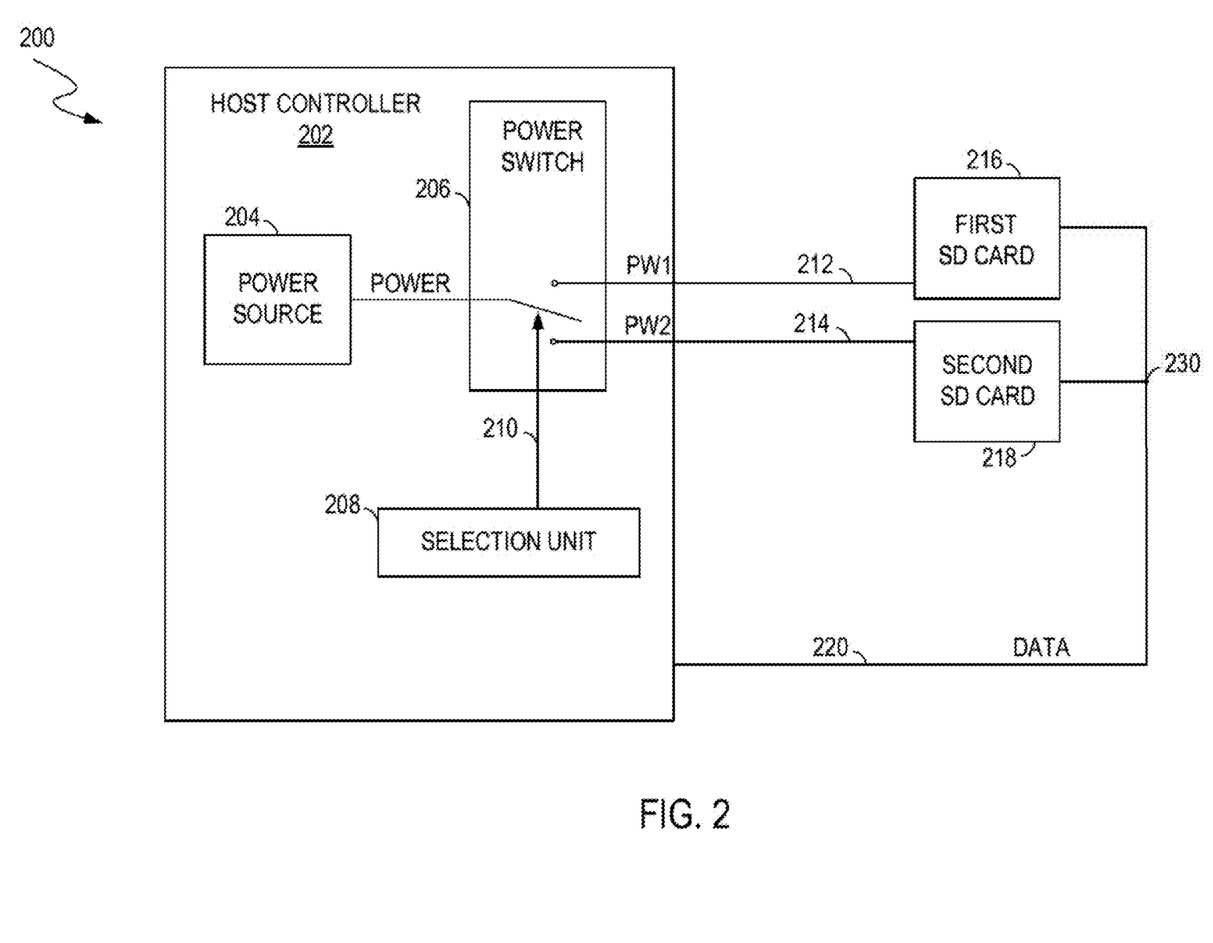
FIG. 2 shows an electronic device that utilizes one host controller to operate two memory cards, in accordance with one embodiment of the present invention.

FIG. 2 shows an electronic device 200 that utilizes one host controller to operate two memory cards, in accordance with one embodiment of the present invention. In the example of FIG. 2, the electronic 200 includes a host controller 202 in communication with a first memory card (e.g., a first SD card 216) and a second memory card (e.g., a second SD card 218). The electronic device 200 also includes a power switch 206 coupled between a power source 204 and the first SD card, and is also coupled between the power source 204 and the second SD card 218. The power switch 206 selectively connects the power source to the first SD card 216 or to the second SD card 218. In the example of FIG. 2, the power switch 206 is integrated in the host controller 202. Alternatively, the power switch 206 may be placed outside of the host controller 202. The host controller 202 further includes a selection unit 208 which generates a selection signal 210 to control the power switch 206 and thus allowing the host controller selectively to operate the first SD card 216 or the second SD card 218. The selection signal 210 has a first state and a second state. The host controller 202 includes a first power terminal PW1 for delivering power to the first SD card 216 and a second power terminal PW2 for delivering power to the second SD card 218. A first power line 212 is coupled between the first power terminal PW1 and the first SD card 216. A second power line 214 is coupled between the second power terminal PW2 and the second SD card 218. A data bus 220 is coupled between the host controller 202 and the first SD card 216, and is also coupled between the host controller 202 and the second SD card 218. More specifically, the data bus 220 is coupled between the host controller 202 and a node 230. The first SD card 216 and the second SD card 218 are both coupled to the node 230.

In operation, if the selection signal 210 is in the first state, the power switch connects the power source 204 to the first SD card 216, and disconnects the power source 204 from the second SD card 218. Therefore, during a first time period when the selection signal 210 is in the first state, power is delivered from the power source 204 through the first power terminal PW1 and the first power line 212 to the first SD card 216. During the first time period, data are transmitted between the host controller 202 and the first SD card 216 through the data bus 220 and the node 230. If the selection signal 210 is in the second state, the power switch 206 connects the power source 204 to the second SD card 218, and disconnects the power source 204 from the first SD card 216. Therefore, during a second time period when the selection signal 210 is in the second state, power is delivered from the power source 204 through the second power terminal PW2 and the second power line 214 to the second SD card 218. During the second time period, data are transmitted between the host controller 202 and the second SD card 218 through the data bus 220 and the node 230.

As described above, according to the present invention, the electronic device selects a first memory device (e.g., by a selection unit), powers up the first memory device by a power source and powers off a second memory device. The electronic device accesses the first memory device while the second memory device is powered off. Then the electronic device selects the second memory device, powers up the second memory device and powers off the first memory device. The electronic device accesses the second memory device while the first memory device is powered off. As such, the electronic device can seamlessly transit between the two memory devices.

Figure 3:
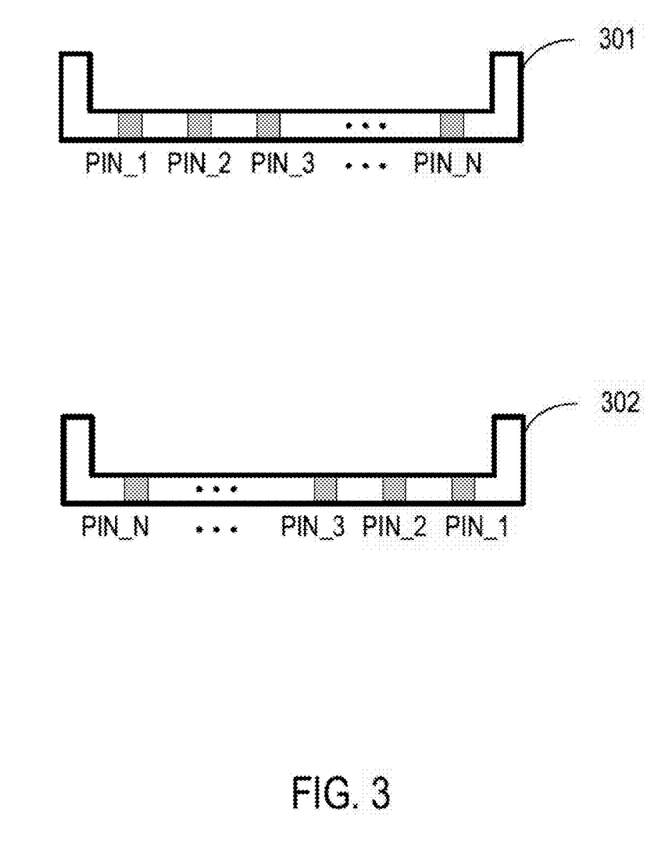
FIG. 3 shows a first memory card socket for receiving the first memory card in FIG. 2, and a second memory card socket for receiving the second memory card in FIG. 2, in accordance with one embodiment of the present invention.

FIG. 3 shows a first memory card socket, e.g., a SD card socket 301, for receiving the first SD card 216 in FIG. 2, and a second memory card socket, e.g., a SD card socket 302 for receiving the second SD card 218 in FIG. 2, in accordance with one embodiment of the present invention. The first SD card socket 301 includes multiple pins PIN_1, PIN_2, PIN_3 . . . and PIN_N for connecting the power line 212 and the data bus 220 to the first SD card 216. The second SD card socket 302 includes multiple pins PIN_1, PIN_2, PIN_3 . . . and PIN_N for connecting the power line 214 and the data bus 220 to the second SD card 218. The physical pin arrangement of the second SD card socket 302 is in an order reversed from the physical pin arrangement of the first SD card socket 301, as illustrated in FIG. 3. The first SD card socket 301 and the second SD card socket 302 transmit and receive same set of data signals via the data bus 220.

Figure 4A:
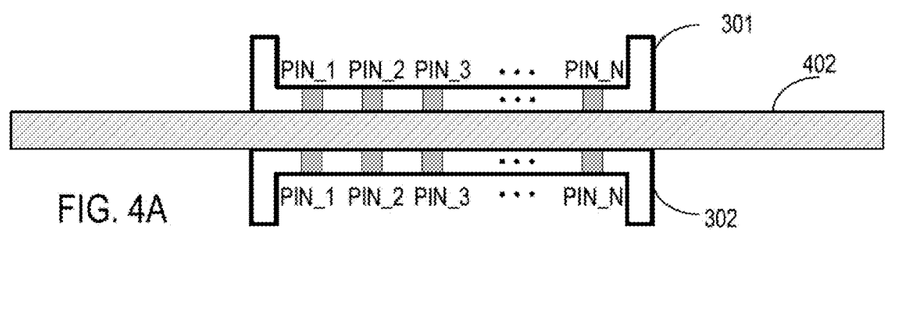
FIG. 4A shows the position of the first memory card socket and the second memory card socket in FIG. 3 when the first memory card socket and the second memory card socket are mounted on a PCB, in accordance with one embodiment of the present invention.

FIG. 4A shows the position of the first SD card socket 301 and the second SD card socket 302 in FIG. 4 when the first SD card socket 301 and the second SD card socket 302 are mounted on a printed circuit board (PCB) 402, in accordance with one embodiment of the present invention. The first SD card socket 301 is mounted on one side of the PCB 402 and the second SD card socket 302 is mounted on the other side of the PCB 402. With such arrangement, the pins labeled with the same number are near each other, located on difference sides of the PCB 402. For example, the pin $PIN_{\_1}$ of the first SD card socket 301 and the pin $PIN_{\_1}$ of the second SD card socket 302 are near each other. In contrast, if two conventional SD card sockets with the same pin arrangement are mounted on different sides of a PCB, the pin $PIN_{\_1}$ of the first SD card socket is near the pin PIN_N of the second SD card socket, and is far from the pin $PIN_{\_1}$ of the second SD card socket.

Figure 4B:
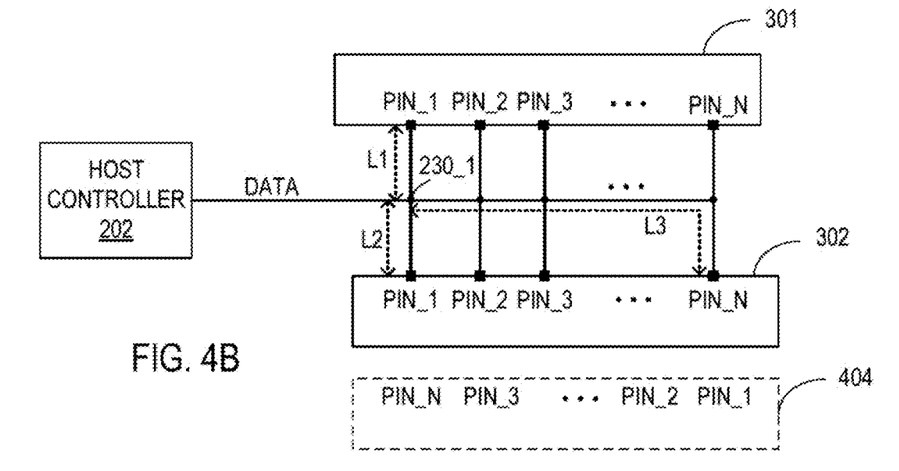
FIG. 4B shows the signal paths from the host controller to the first memory card socket and the second memory card socket when the first memory card socket and the second memory card socket are mounted on a PCB.

FIG. 4B shows the signal paths from the host controller 202 to the first SD card socket 301 and the second SD card socket 302 when the first SD card socket 301 and the second SD card socket 302 are mounted on a PCB. Assume that the signal from the host controller 202 to the pin PIN_1 of the first SD card socket 301 and to the pin PIN_1 of the second SD card socket 302 splits at a split point 230_1. The length from the split point 230_1 to the pin PIN_1 of the first SD card socket 301 is L1. The length from the split point 230_1 to the pin PIN_1 of the second SD card socket 302 is L2. The length from the split point 230_1 to the pin PIN_N of the second SD card socket 302 is L3. The transmission speed of the signal on the PCB is V.

If a first SD card in the first SD card socket 301 is selected to be powered, signal at the pin PIN_1 of the first SD card socket 301 has a combined waveform. An original waveform is transmitted from the host controller 202 directly to the pin PIN_1 of the first SD card socket 301. The original waveform is also transmitted to the pin PIN_1 of the second SD card socket 302 and is reflected at the pin PIN_1 of the second SD card socket 302 to generate a reflected waveform. The reflected waveform overlaps with the original waveform at the pin PIN_1 of the first SD card socket 301 to create the combined waveform. The time difference of the original waveform arriving at the pin PIN_1 of the first SD card socket 301 and the reflected waveform arriving at the pin PIN_1 of the first SD card socket 301 can cause signal distortion at the pin PIN_1 of the first SD card socket 301.

If two conventional SD card socket is adopted, the pin PIN_1 of a conventional SD card socket 404 mounted on the bottom of the PCB would be at the position of pin PIN_N of the second SD card socket 302 shown in FIG. 4B, which is far from pin PIN_1 of the first SD card socket 301. An original waveform takes time L1/V to transmit from the split point 230_1 to the pin PIN_1 of the first SD card socket 301. A reflected waveform takes time (2*L3+L1)/V to transmit from the split point 230_1 to the pin PIN_1 of the first SD card socket 301. The time difference of the original waveform and the reflected waveform is 2*L3/V.

In contrast, the present invention adopts a first SD card socket 301 with a conventional pin order mounted on the top of the PCB 402, and a second SD card socket with a reversed pin order mounted on the bottom of the PCB 402. The original waveform takes time L1/V to transmit from the split point 230_1 to the pin PIN_1 of the first SD card socket 301. The reflected waveform takes time (2*L2+L1)/V to transmit from the split point 230_1 to the pin PIN_1 of the first SD card socket 301. The time difference of the original waveform and the reflected waveform is 2*L2/V. As can be seen from FIG. 4B, L2 is shorter than L3. Therefore, by adopting a first SD card socket 301 with a conventional pin order and a second SD card socket 302 with a reversed pin order, the time difference of the original waveform and the reflected waveform is decreased and thus the signal quality at the pin PIN_1 of the first SD card socket 301 is improved.

Figure 5:
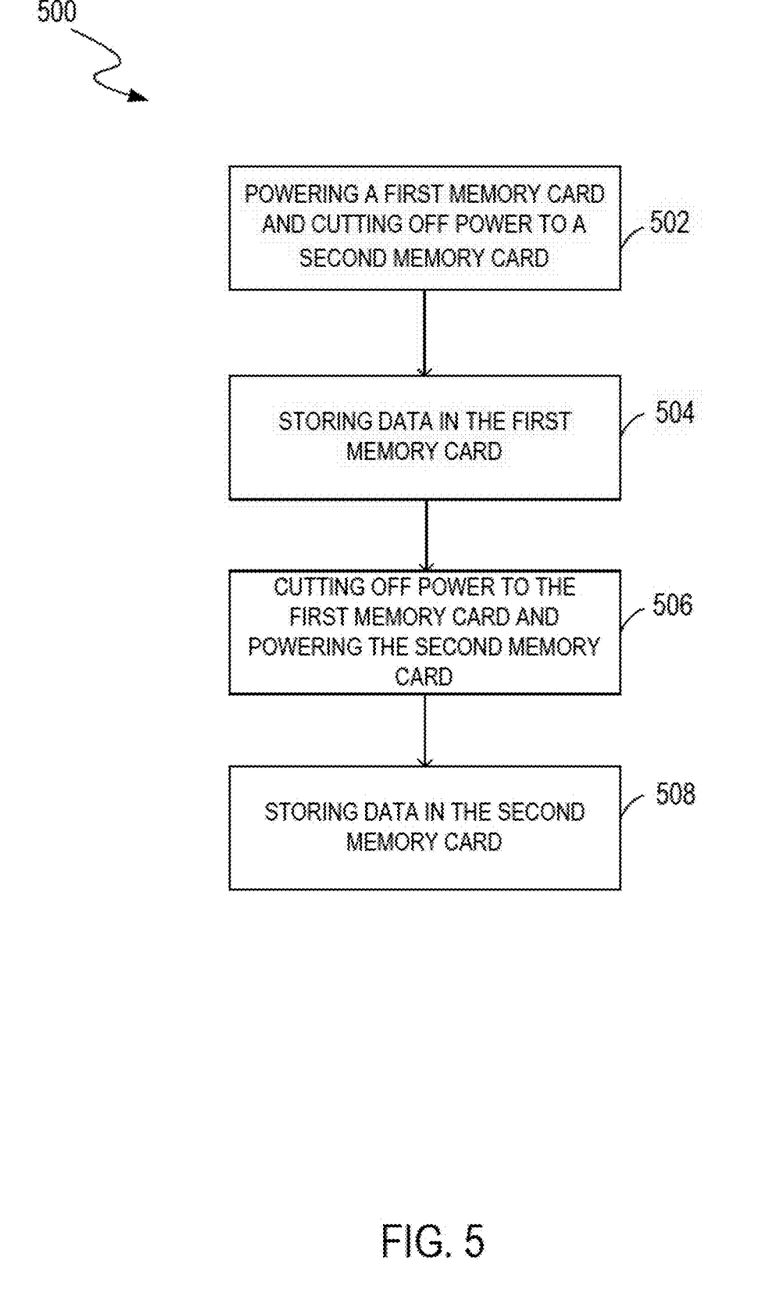
FIG. 5 shows a method for operating an electronic device which includes two memory cards, in accordance with one embodiment of the present invention.

FIG. 5 shows a method 500 for operating an electronic device which includes a first memory card and a second memory card, (e.g., a first SD card 216 and a second SD card 218), in accordance with one embodiment of the present invention. FIG. 6 is described in combination with FIG. 2.

The electronic device selects one SD card according to system software. In one embodiment, the electronic device is programmed to store a first type of data (e.g., raw image files) in a first SD card and to store a second type of data (e.g., JPEG files) in a second SD card. Alternatively, the electronic device may be programmed to store data in a first SD card until the first SD card is full, and then to store data in the second SD card. In block 502, if the electronic device needs to operate the first SD card 216, the electronic device powers the first SD card 216, and cuts off power to the second SD card 218. More specifically, during a first time period, the electronic device controls a power switch 206 to connect a power source 204 and the first SD card 216, and to disconnect the power source 204 and the second SD card 218.

In block 504, the electronic device stores data in the first SD card 216. Data is transmitted from a host controller, e.g., a host controller 202 in FIG. 2 or a host controller 302 in FIG. 3, to the first SD card 216 through a data bus 220. Since the second SD card 218 is disconnected from the power source, the second SD card 218 does not receive data and thus it does not have impact on the operation.

In block 506, the electronic device cuts off power to the first SD card 216 and powers the second SD card 218. More specifically, during a second time period, the electronic device controls the power switch 206 to connect the power source 204 and the second SD card 218, and to disconnect the power source 204 and the first SD card 216.

In block 508, the electronic device stores data in the second SD card 218. Data is transmitted from a host controller to the second SD card 218 through the data bus 220. Since the first SD card 216 is disconnected from the power source, the first SD card 216 does not receive data and thus it does not have impact on the operation.

Accordingly, embodiments in accordance with the present invention provide devices and methods for operating a first memory card and a second memory card. Advantageously, the electronic devices according to present invention selectively power one memory card of the two memory cards and operate the powered memory card. The two memory cards shares a host controller and a data bus. The host controller selects one memory card to operate by controlling a power switch coupled between a power source and the first memory card, and between the power source and the second memory card. The power switch selectively connects the power source to the first memory card or to the second memory card. Advantageously, only one host controller is needed to control the two memory cards and thus the cost is reduced. Because the host controller according to present invention does not access multiple SD cards at a time, additional buffer or other devices to achieve data/clock isolation can be eliminated. Therefore, the cost is reduced.

Furthermore, the present invention provides a SD card socket having a physical pin arrangement that is in an order reversed from the physical pin arrangement of a convention SD card socket. By using a conventional SD card socket and a SD card socket with a reversed pin arrangement, the signal path of a reflected waveform is decreased. As a result, the signal distortion caused by signal reflection is reduced and thus the signal quality is improved.

The present invention also provides seamless transition between two SD cards. For a device equipped with the present invention, two SD cards are allowed to be inserted in two SD card sockets simultaneously, but only one SD card is seen by the system at any time. If the device is storing data in a first SD card and it reaches the storage limit of the first SD card, the device can immediately switch to the second SD card and continue to store data in the second SD card without the need to remove the first SD card and insert the second SD card. In this way, only one SD card is powered at a time, but the system has access to both SD cards.

In the example of the present invention, the memory cards are SD cards. However, in other embodiment, the memory cards can be different type of memory storage devices such as Compact Flash card, Memory Stick and xD-Picture card.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An electronic device comprising:
a host controller;
a first socket, in communication with the host controller, for receiving a first memory card, the first socket having a physical pin arrangement and mounted on one side of a printed circuit board (PCB); and
a second socket, in communication with the host controller, for receiving a second memory card, the second socket having a physical pin arrangement and mounted on an opposite side of the PCB, the physical pin arrangement of the second socket is in an order reversed from the physical pin arrangement of the first socket such that a first pin of the first socket and a corresponding first pin of the second socket are aligned vertically on opposite sides of the PCB, wherein the host controller transmits power to the first memory card and cuts off power to the second memory card during a first time period, and cuts off power to the first memory card and transmits power to the second memory card during a second time period, the first socket and the second socket transmitting and receiving same set of data signals.

2. The electronic device of claim 1, further comprising:
a power switch coupled between a power source and the first memory card, and between the power source and the second memory card, wherein the power switch connects the power source and the first memory card and disconnects the power source and the second memory card during the first time period, and connects the power source and the second memory card and disconnects the power source and the first memory card during the second time period.

3. The electronic device of claim 2, wherein the power switch is in the host controller.

4. The electronic device of claim 1, further comprising:
a selection unit for generating a selection signal having a first state and a second state,
wherein the first memory card is selected to be powered by the host controller if the selection signal is in the first state, and wherein the second memory card is selected to be powered by the host controller if the selection signal is in the second state.

5. The electronic device of claim 1, further comprising:
a data bus coupled between the host controller and a node, wherein the first memory card and the second memory card are coupled to the node, and wherein data are transmitted between the host controller and the first memory card via the node during the first time period, and wherein data are transmitted between the host controller and the second memory card via the node during the second time period.

6. The electronic device of claim 1, further comprising:
a first power line coupled between the host controller and the first memory card and for transmitting power to the first memory card during the first time period;
a second power line coupled between the host controller and the second memory card and for transmitting power to the second memory card during the second time period; and
a data bus coupled between the host controller and the first memory card and coupled between the host controller and the second memory card,
wherein data are transmitted between the host controller and the first memory card via the data bus during the first time period, and wherein data are transmitted between the host controller and the second memory card via the data bus during the second time period.

7. The electronic device of claim 1, wherein the first memory card and the second memory card are secure digital cards.

8. An electronic device comprising:
a host controller;
a first socket, in communication with the host controller, for receiving a first memory card, the first socket having a physical pin arrangement and mounted on one side of a printed circuit board (PCB); and
a second socket, in communication with the host controller, for receiving a second memory card, the second socket having a physical pin arrangement and mounted on an opposite side of the PCB, the physical pin arrangement of the second socket is in an order reversed from the physical pin arrangement of the first socket such that a first pin of the first socket and a corresponding first pin of the second socket are aligned vertically on opposite sides of the PCB, wherein the host controller comprises:
a first power terminal for powering the first memory card;
a second power terminal for powering the second memory card; and
a power switch coupled to the first power terminal and the second power terminal and for selectively delivering power to one memory card of the first memory card and the second memory card;
wherein during a first time period, the host controller transmits power to the first memory card and cuts off power to the second memory card, and wherein during a second time period, the host controller transmits power to the second memory card and cuts off power to the first memory card,
and wherein the first socket and the second socket transmit and receive same set of data signals.

9. The electronic device of claim 8, wherein the power switch is in the host controller.

10. The electronic device of claim 8, further comprising:
a selection unit for generating a selection signal to control the power switch.

11. The electronic device of claim 8, further comprising:
a data bus coupled between the host controller and a node, and for transmitting data between the host controller and the first memory card via the node, and for transmitting data between the host controller and the second memory card via the node,
wherein the first memory card and the second memory card are coupled to the node.

12. The electronic device of claim 8, wherein the first memory card and the second memory card are secure digital cards.

13. A method for operating an electronic device, the method comprising the steps of:
receiving a first memory device in a first socket mounted on a first side of a printed circuit board (PCB);
receiving a second memory device in a second socket mounted on a second side of the PCB, the second side being opposite of the first side and a first pin of the first socket and a corresponding first pin of the second socket are aligned vertically on opposite sides of the PCB;
controlling a power switch coupled between a power source, the first memory device, and the second memory device;
connecting the power source to the first memory device if the power switch is coupled between the power source and the first memory device;
connecting the power source to the second memory device if the power switch is coupled between the power source and the second memory device;
powering the first memory device and cutting off power to the second memory card; and
powering the second memory device and cutting off power to the first memory card.

14. The method of claim 13, further comprising:
generating a selection signal having a first state and a second state;
powering the first memory card and cutting off power to the second memory card if the selection signal is in the first state; and powering the second memory card and cutting off power to the first memory card if the selection signal is in the second state.

15. A method, for seamless transition between two memory devices, comprising the steps of:
- receiving a first memory device in a first socket mounted on a first side of a printed circuit board (PCB);
- receiving a second memory device in a second socket mounted on a second side of the PCB, the second side being opposite of the first side and a first pin of the first socket and a corresponding first pin of the second socket are aligned vertically on opposite sides of the PCB;
- selecting, by a selection unit, the first memory device;
- powering up, by a power source, the first memory device;
- powering off the second memory device;
- accessing the first memory device while the second memory device is powered off;
- selecting, by the selection unit, the second memory device;
- powering up, by the power source, the second memory device;
- powering off the first memory device; and
- accessing the second memory device while the first memory device is powered off.

* * * * *